United States Patent [19]

Howard

[11] Patent Number: 5,754,816
[45] Date of Patent: May 19, 1998

[54] DATA STORAGE APPARATUS AND METHOD WITH TWO STAGE READING

[75] Inventor: David William Howard, Cherry Hinton, United Kingdom

[73] Assignee: Advanced Risc Machines Limited, Cambridge, United Kingdom

[21] Appl. No.: 675,369

[22] Filed: Jul. 2, 1996

Related U.S. Application Data

[63] Continuation of Ser. No. 294,547, Aug. 23, 1994, abandoned.

[30] Foreign Application Priority Data

Sep. 27, 1993 [GB] United Kingdom ............ 9319898

[51] Int. Cl.$^6$ .................. G06F 12/10; G06F 13/00
[52] U.S. Cl. .................. 395/413; 364/DIG. 1; 364/243.4; 395/418; 395/450; 395/471; 395/473; 395/445
[58] Field of Search ............ 364/DIG. 1, DIG. 2, 364/900, 243.4; 365/49, 189.06; 395/497.03, 418, 471, 472, 413, 450, 445

[56] References Cited

U.S. PATENT DOCUMENTS

| | | | |
|---|---|---|---|
| 4,400,774 | 8/1983 | Toy | 395/474 |
| 4,712,190 | 12/1987 | Guglielmi et al. | 395/474 |
| 4,737,909 | 4/1988 | Harada | 364/200 |
| 4,833,649 | 5/1989 | Greub | 365/189.06 |
| 5,025,366 | 6/1991 | Baror | 395/455 |
| 5,155,824 | 10/1992 | Edenfield et al. | 395/470 |
| 5,226,130 | 7/1993 | Favor et al. | 395/375 |
| 5,317,712 | 5/1994 | Peek et al. | 395/497.03 |
| 5,325,325 | 6/1994 | Azuma | 365/156 |
| 5,339,268 | 8/1994 | Machida | 365/49 |
| 5,398,212 | 3/1995 | Imura et al. | 365/230.08 |
| 5,459,691 | 10/1995 | Howard | 365/201 |

FOREIGN PATENT DOCUMENTS 2 024 475 A   1/1980   United Kingdom ............ G06F 13/00

*Primary Examiner*—Tod P. Swann
*Assistant Examiner*—Tuan V. Thai
*Attorney, Agent, or Firm*—Fenwick & West LLP

[57] ABSTRACT

A data memory is described in which data words comprising access control bits and further bits are stored at each memory location 34. When a particular memory location is addressed, then the access control bits stored at that memory location are output to control logic 12, 46 that serves to generate a valid access signal. The valid access signal is fed back to the selected memory location and controls whether the further bits stored at that memory location are output. If access to those further bits is not permitted by the access control bits, then the further bits are not output and power is saved. The control logic is responsive to hardware and software flags in addition to the access control bits. The system is particularly suited for use in conjunction with a cache memory.

6 Claims, 7 Drawing Sheets

DATA STORAGE APPARATUS AND METHOD WITH TWO STAGE READING

This is a continuation of application Ser. No. 08/294,547, filed on Aug. 23, 1994, now abandoned.

BACKGROUND OF THE INVENTION

1. Field of the Invention

This invention relates to data processing utilizing data memories. More particularly, this invention relates to systems in which a multi-bit data word at a storage location being accessed contains access control bits for use in determining whether that access operation is a valid access operation.

2. Description of the Prior Art

It is known to provide data memories, such as the address translation cache as shown in FIG. 1 of the accompanying drawings, for mapping input virtual addresses to output physical addresses. An input virtual address 2 is supplied to a cache TAG unit 4, in this case a CAM unit, which contains N virtual addresses whose corresponding physical addresses are held within the address translation cache and that can be compared with the input virtual address 2.

When a virtual address match occurs, such as at virtual address #3, then a read enable signal is generated for that cache line 6. The access control bits 8 and the physical address 10 are then both 20 switched to the respective access control bits bus and physical address bus. The access control bits are input to a control logic unit 12 together with other system flags and signals. The control logic unit 12 generates a valid access signal that is either true or false. The physical addresses are stored within a buffer 14 from which they are read, as required, if the valid access signal indicates that the access to that physical address should be allowed.

It is an aim within the design of such systems that the power consumption should be low. A low power consumption reduces problems due to the build up of heat within the circuits and increases the usable period in power critical situations such as portable battery powered devices.

SUMMARY OF THE INVENTION

It is an object of the invention to provide a low power data memory.

The invention recognizes that when the access control bits indicate that access to the further bits of the data word is not valid, then the power consumed in outputting those further bits from the data memory is wasted. More particularly, the output data bus lines for the further bits will have a relatively large capacitance and so require a relatively large charge to be driven onto them to establish them at the voltages of the further bits for output purposes. In this case, the access controller generates the second access enable signal that can control output of the further bits to avoid their output should the access control bits indicate that the access operation is invalid.

A particularly convenient manner in which the first access enable signal and the second access enable signal may serve to provide this control is one in which each storage location comprises a plurality of bit storage cells, each bit storage cell for said one or more access control bits being coupled to an access bit output bus by a gate switched by said first access enable signal and each bit storage cell for said one or more further bits being coupled to a further bit output bus by a gate switched by said second access enable signal.

The access controller may be simply an arrangement whereby a single access control bit (e.g. serving to indicate whether a cache line within the address translation cache has been loaded with valid data) is directly used to generate the second access enable signal. However, to accommodate more sophisticated arrangements it is preferred that said access controller comprises: control logic responsive to said one or more access control bits for generating a valid access signal.

With such control logic, the generation of the second access enable signal can be made dependent upon multiple access control bits, and/or various access control flags that may be set dependent upon processing modes of a central processing unit or under software control.

A preferred mechanism whereby the valid access signal generated by the control logic may serve to provide the second access enable signal at the appropriate storage location is to provide that said access:

controller includes for each storage location, an AND gate having a first access enable signal as a first input, a valid access signal as a second input and said second access enable signal as an output.

In this way, the valid access signal need not be switched to a particular storage location and can instead be supplied to all storage locations (as is more convenient). The AND gate together with the first access enable signal and valid access signal thereby serve to generate the second access enable signal for the specific storage location being accessed.

The invention is particularly suited for use in systems including cache hit signal generator for generating a cache hit signal indicative of sought data being present in said cache memory; wherein the access controller is responsive to the cache hit signal to disable output of said further bits.

In a case where the further bits to be read from the data memory are not required should a cache hit occur, then, if the cache is effectively implemented such that a high frequency of cache hits occur, it may be as few as one in ten of the access attempts to the data memory that result in the further bits needing to be outputted. This represents a significant power saving. It will be appreciated that the cache data memory discussed above could itself be holding the further bits or may merely be holding some other data that renders reading of the further bits unnecessary.

In preferred embodiments the data memory is an address translation cache, the input address signal is a virtual address to be translated to a physical address and the one or more further bits are the physical address.

In such embodiments, whether a particular physical address should be allowed to be accessed can be dependent upon a relatively complex number of differing circumstances such as: processor mode, software flags and whether the data being sought is present in a cache data memory.

In the case of the use to map virtual addresses to physical addresses, the physical addresses generated are advantageously stored within a buffer from where the relatively slower access to off-chip physical memory may then be made.

It will be appreciated that the invention could be implemented as discrete components, but that it is particularly preferred that implementations have the form of an integrated circuit.

Viewed from another aspect this invention provides a method of data processing using a data memory, data processing using a data memory by which multi-bit data words are stored in a plurality of storage locations of the data memory, where each storage location has an associated address, and a first access enable signal is generated in response to an input address signal indicative of a storage location storing a data word to be accessed for selecting the storage location from among the plurality of storage locations, and for enabling output from the storage location of one or more access control bits of the data word, and a second access enable signal is generated in response to said one or more access control bits, for enabling output from the storage location of one or more further bits of the data word.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
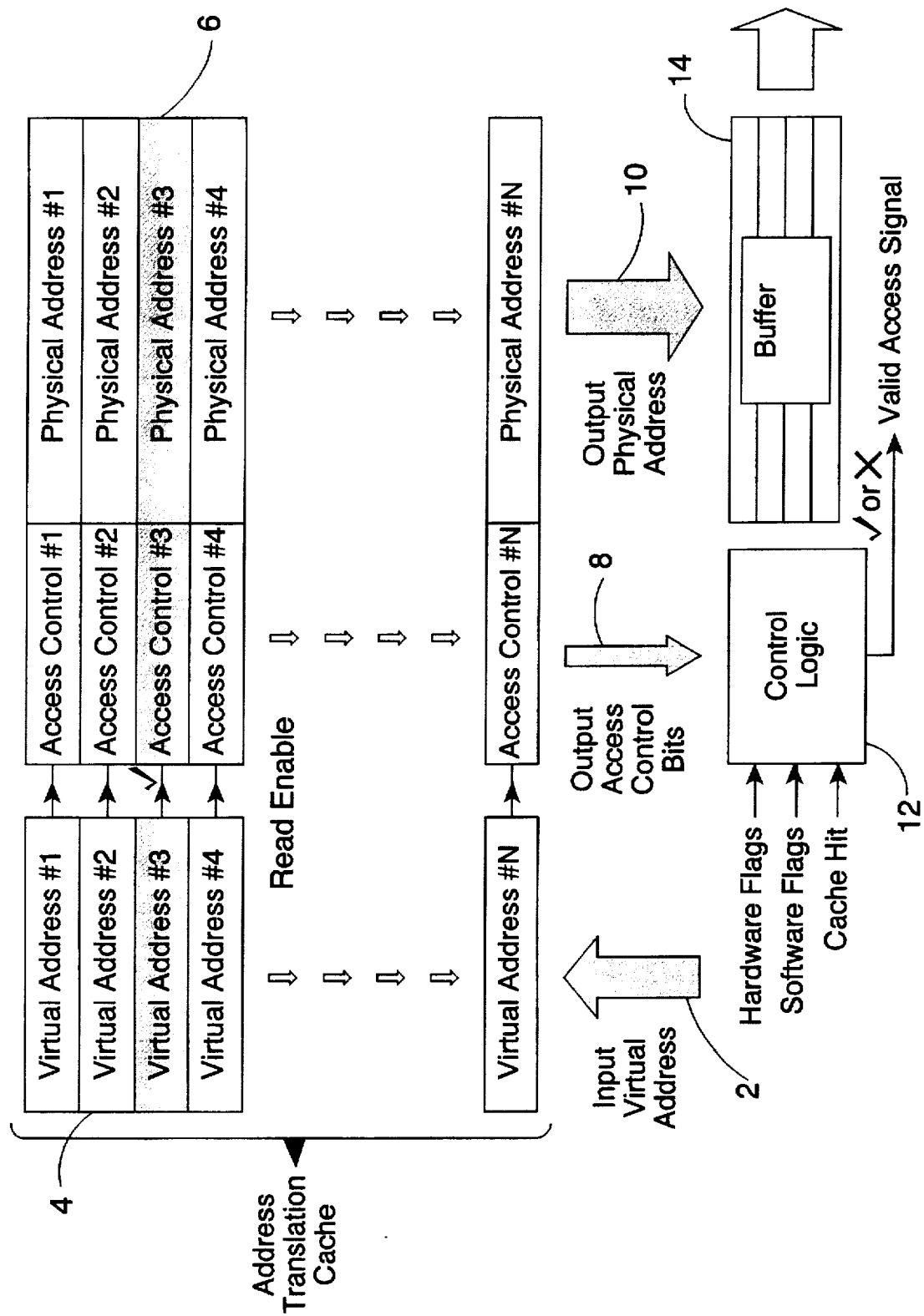
FIG. 1 illustrates a known address translation cache.
Figure 2:
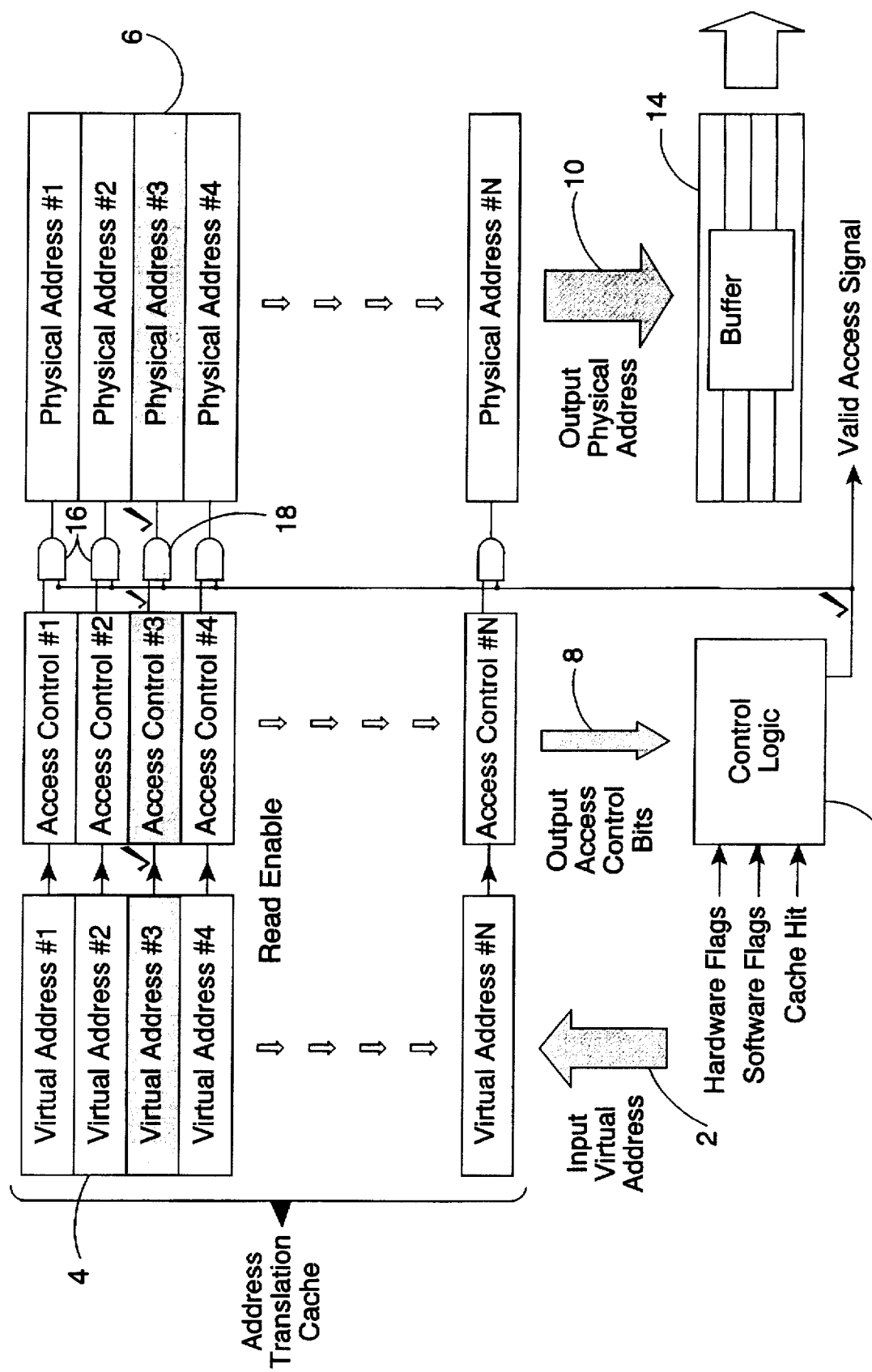
FIG. 2 illustrates an address translation cache in accordance with one embodiment of the invention in which the addressed access control bits are indicating that a valid access is being made.

FIG. 2 illustrates a data memory in the form of an address translation cache embodying one example of the present invention. The form and operation of this address translation cache differs from that previously discussed in relation to FIG. 1 by the introduction of access control means in the form of AND gates 16 and the control logic 12. The AND gates 16 are disposed between the part of the cache lines storing the access control bits and the part of the cache lines storing the physical addresses. The first access enable signal in the form of the read enable signal from the TAG unit 4 serves to connect the access control bits in the selected cache line 6 to the output via which they pass to the control logic unit 12.

The first access enable signal also propagates through the portion of the cache line holding the access control bits and to reach one input of the AND gate 18. The control logic unit 12 is responsive to the access control bits, hardware flags, software flags and a cache hit signal to produce a valid access signal. This valid access signal is supplied in parallel to all of the AND gates 16, 18 as their second input. Thus, in the case of the AND gate 18, both inputs are true and the output will be true thereby forming the second access enable signal that triggers the placing of the physical address bits onto the physical address output bus.

The hardware flags supplied to the control logic unit 12 can indicate factors such as the processor mode of a central processing unit in which the address translation cache is situated or other factors such as the memory configuration of the system. The software flags supplied to the control logic unit 12 are set under program control and can serve the function of protecting differing storage areas corresponding to differing physical addresses from access by program threads (in a multitasking system) or program objects (in an object oriented system) that should not have access to those memory locations.

In FIG. 2 the access attempted is a valid access and the valid access signal is asserted as true. Thus, the physical address is output as indicated by the shading of the arrow to the buffer 14.

Figure 3:
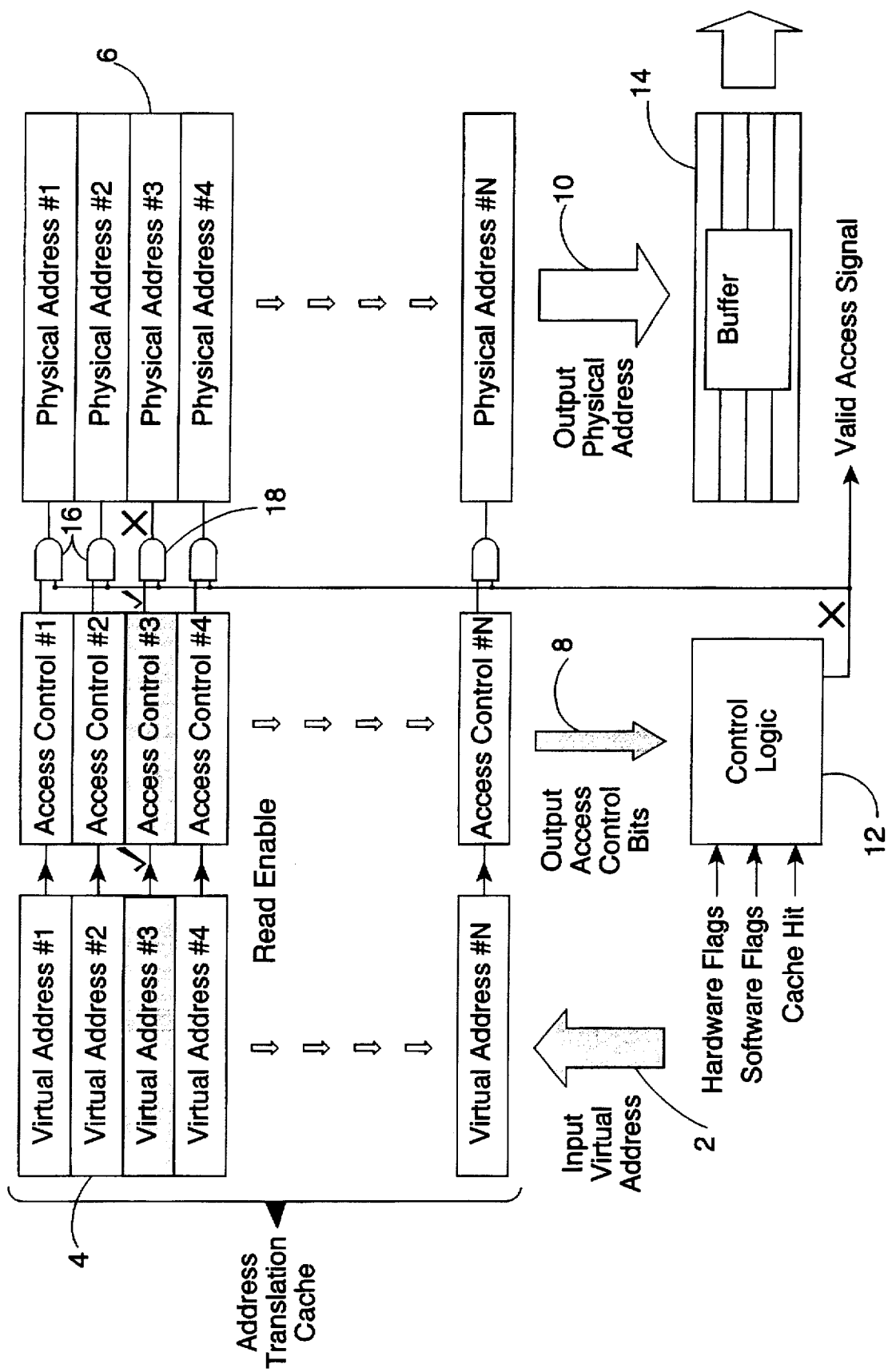
FIG. 3 illustrates the circuit of FIG. 2 in which the addressed access control bits are indicating that an invalid access is being made.

In FIG. 3, the operation of the TAG unit 4 and the reading of the access control bits from the cache line 6 proceeds as for FIG. 2. However, in this case the control logic unit 12 determines that the access being attempted is invalid and so the valid access signal is asserted false. This ensures that all of the AND gates 16, 18 are switched off with an output of false. The output from the AND gate 18 that forms the second access enable signal is false and so the physical address bits from the cache line 6 are not output to the buffer 14. This saves power.

Figure 4:
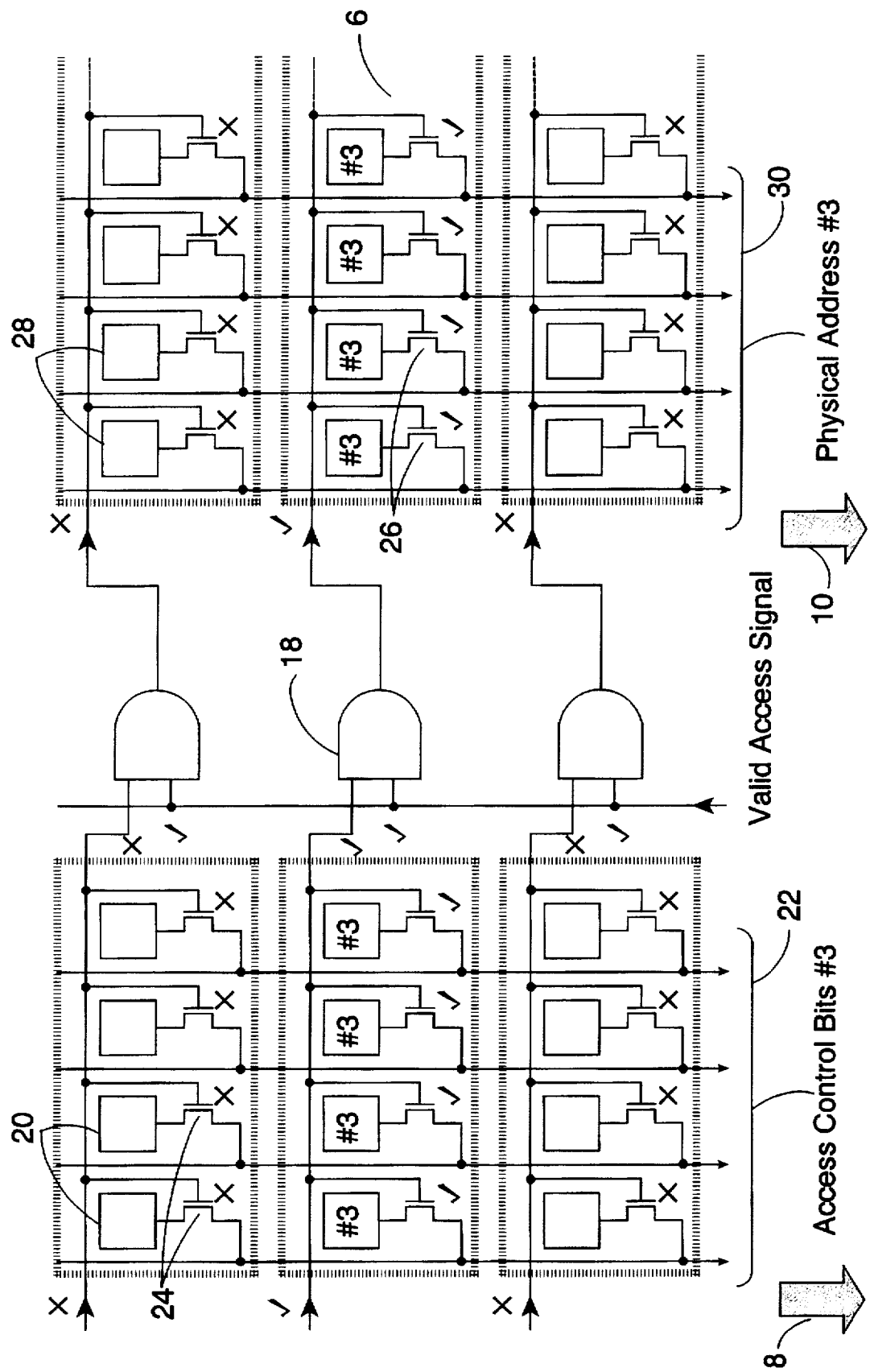
FIGS. 4 and 5 illustrate in more detail corresponding respective portions of FIGS. 2 and 3.

FIG. 4 illustrates a portion of the circuit of FIG. 2. The access control bits are stored in memory cells 20 that are each connected to an access control bit bus 22 via gates 24. The gates 24 comprise field effect transistors that are non-conductive when their gate electrodes are false. The gate electrodes are connected in parallel to the read enable outputs from the differing lines within the TAG unit 4. In this case, the cache line #3 is the one in which a virtual address match occurs and thus a read enable signal (first access enable signal) is output from the TAG unit 4 to this line to select it for output, with all the other lines being de-selected. The first access enable signal that passes directly to the gates 24 for the access control bits of the cache line 6 and these bits are accordingly output on the access control bit bus 22. The control logic 12 responsive to these bits then returns a valid access signal indicative of whether access is to be permitted to the corresponding physical address bits.

In this case, access is to be permitted and the valid access signal is true. Thus, both inputs to the AND gate 18 are true and so its output is true. The output of the AND gate 18 comprises the second access enable signal and this is fed to the gates 26 that couple each of the memory cells 28 storing the physical address bits to a physical address bus 30. In this way, the physical address bits are output from the data memory.

Figure 5:
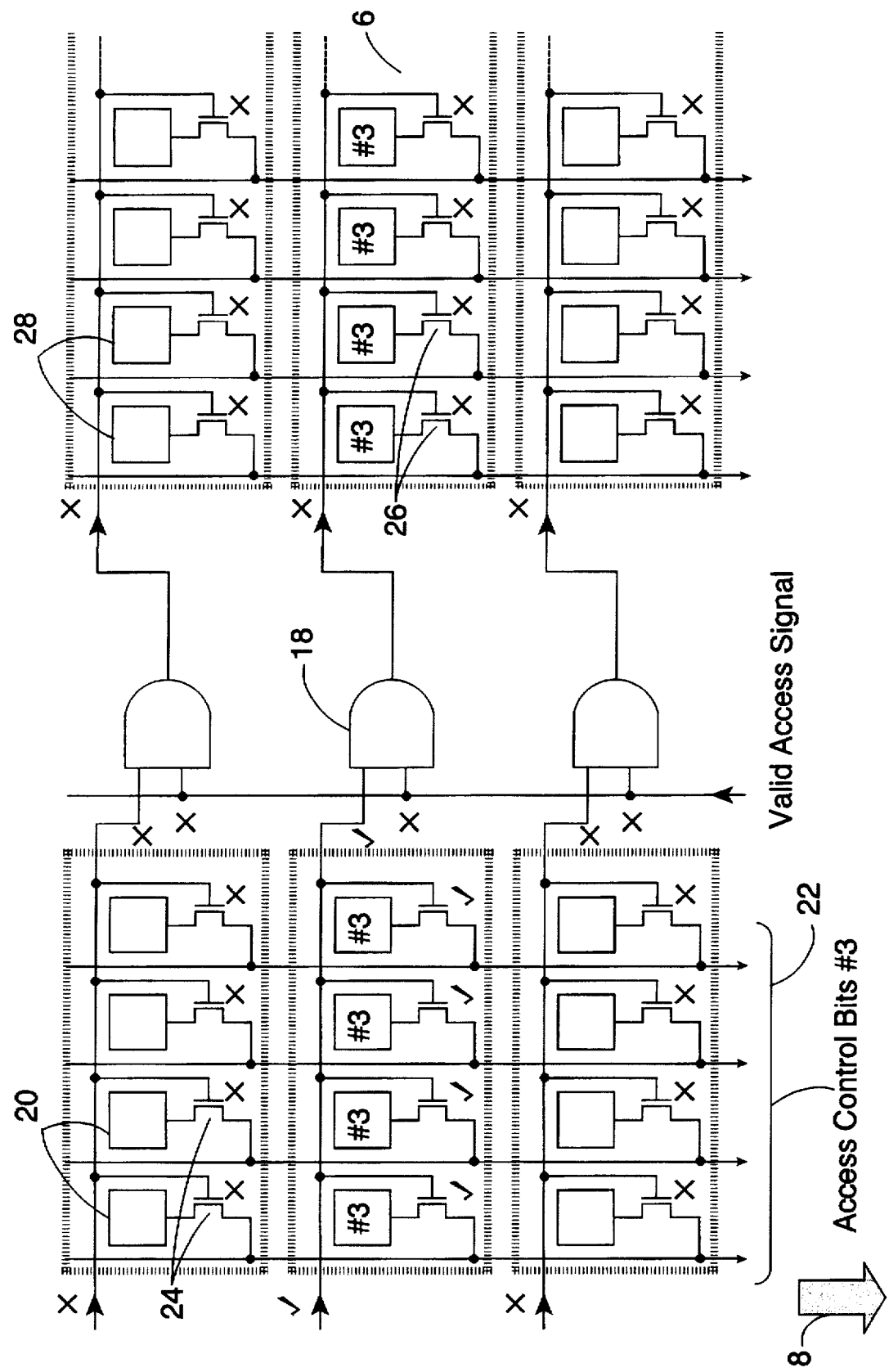

FIG. 5 illustrates the same circuit portion as FIG. 4, but in this case corresponding to the situation illustrated in FIG. 3. The access control bits are accessed in the same manner as described in relation to FIG. 4. However, the result returned by the control logic 12 is that the valid access signal is false indicating that access is not permitted to the physical address bits of the cache line 6 for the particular set of inputs detected by the control logic 12.

Thus, one input to the AND gate 18 is the first access enable signal that is true, with the second input being the valid access signal that is false resulting in a false value for the second access enable signal output from the AND gate 18. This false second access enable signal holds the gates 26 switched off with the result that the physical address bits for the cache line 6 are not output to the physical address bus 30.

Figure 6:
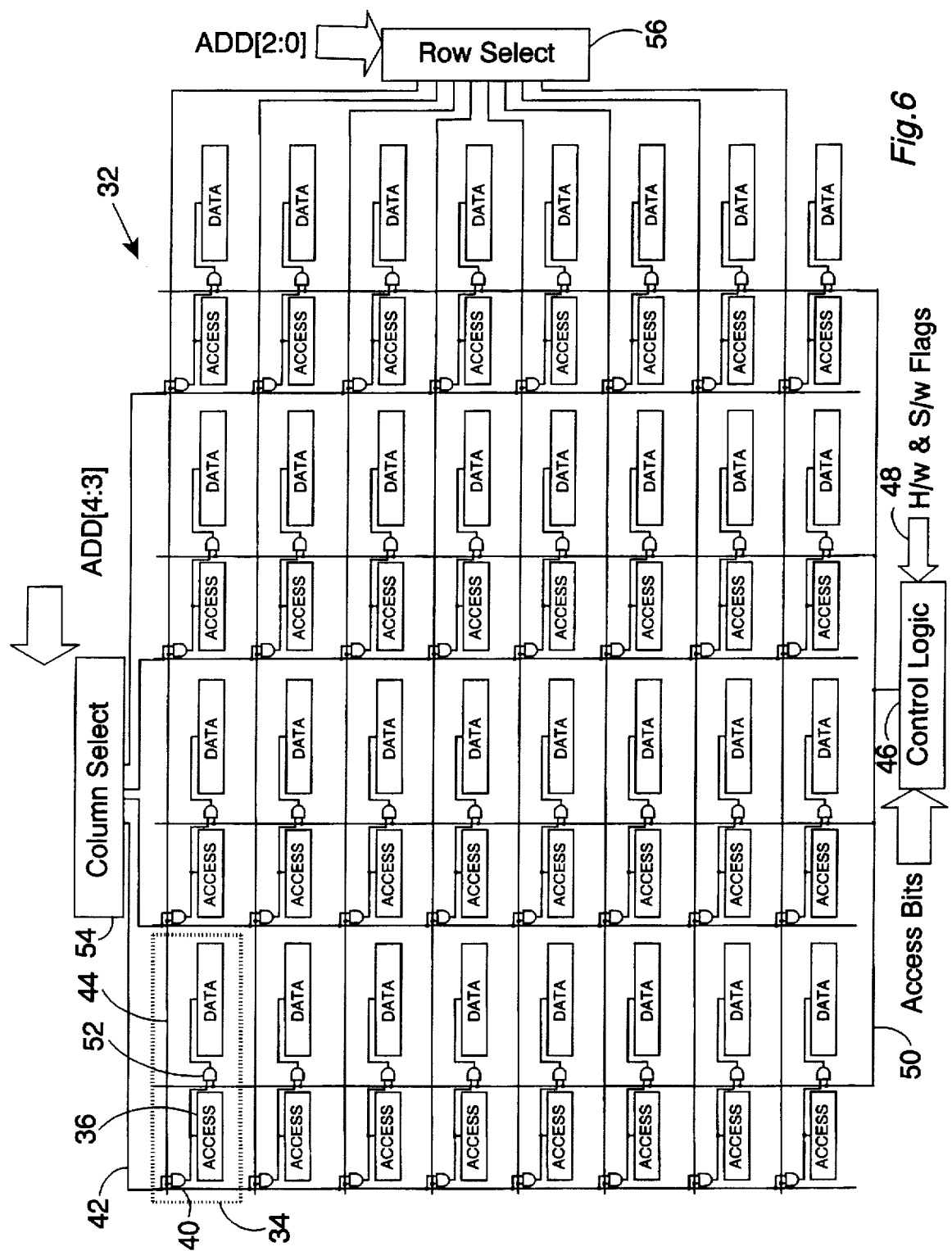
FIG. 6 illustrates another embodiment of the invention in the form of a random access memory (RAM)

FIG. 6 illustrates another embodiment of the invention in the form of a data memory comprising a column and row addressed RAM 32. The RAM 32 is composed of an array of word cells 34. Each word cell 34 contains access bit storage cells 36 and further bit storage cells 38. The word cell 34 also contains a cell selecting AND gate 40 with its two inputs respectively connected to a column selecting line 42 and a row selecting line 44. When the column selecting line 42 and the row selecting line 44 are both true for a particular word cell 34, the cell selecting gate 140 for that cell is switched on and asserts a true output that serves as the first access controlling signal. This triggers the access controlling bits to be output.

These access controlling bits pass via an access bit bus (not illustrated for the purposes of simplicity) to control logic 46 where in combination with hardware and software flags 48 they are decoded to produce a valid access signal on valid access signal line 50. The valid access signal line 50 is connected in parallel to all of the word cells 34. Within each word cell 34 the valid access signal is input to one terminal of a further bit selecting gate 52, the other input to the further bit selecting gate 52 being the output from the cell selecting gate 40. If both of these inputs are true, then the output from the further bit selecting gate 52 will be true and the further bits stored within the further bit memory cells 38 will be output onto a further bit output bus (not illustrated for the purposes of simplicity). The output from the further bit selecting gate 52 thus comprises a second access enabling signal.

If the control logic 46 returns a valid access signal that is false, then the further bit selecting gate 52 will output a false value and the further bits will not be output.

The overall action of the RAM 32 is that a particular data word is selected via the column selector 54 and the row selector 56 decoding the uppermost two bits and lowermost three bits of a memory address. When a particular word cell 34 has been selected, then the access bits are output, decoded by the control logic 46 and a valid access signal returned to the selected memory cell (and all other memory cells in parallel) to control whether the further bits are also output. Thus, when access is not permitted, the further bits are not output and power is saved.

Figure 7:
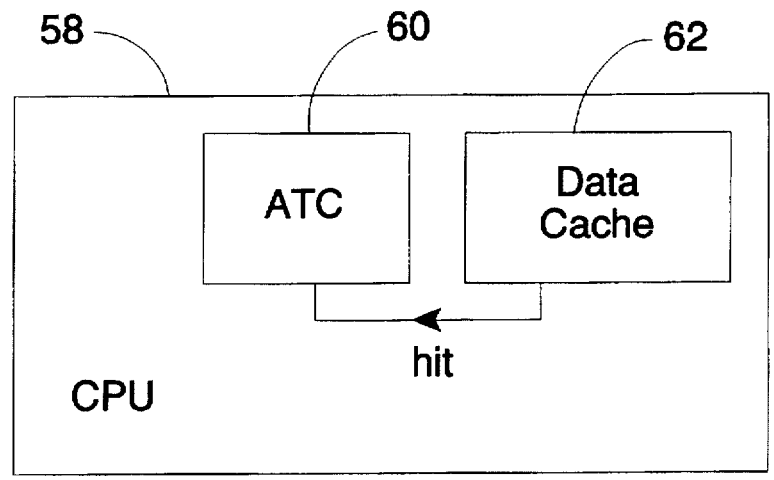
FIG. 7 is a block schematic diagram of a central processing unit incorporating one embodiment of the present invention.

FIG. 7 illustrates a central processing unit 58 incorporating an address translation cache (ATC) 60 and a cache data memory 62. If a cache "hit" occurs within the cache data memory 62 then a "hit" signal is passed to the address translation cache 60 indicating that the physical address need not be read, thus saving power.

Figure 8:
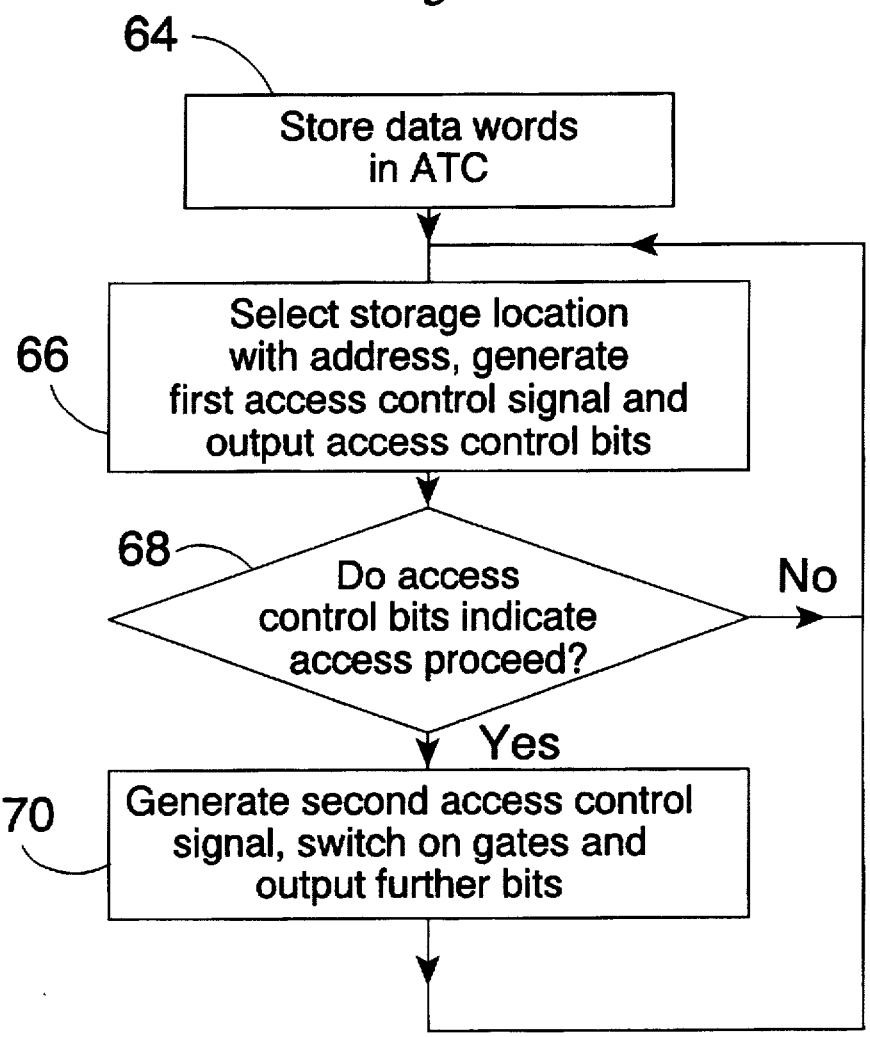
FIG. 8 is a flow diagram illustrating the method of operation of the circuits illustrated in FIGS. 2 through 6.

The flow diagram of FIG. 8 illustrates the method of operation of the circuits of FIGS. 2 through 6. Physical addresses, virtual addresses, and access control bits are stored 64 in the address translation cache 60. A match is made 66 with one of the stored virtual addresses and a particular cache line is selected and the reading of the access control bits is enabled. These access control bits are evaluated 68 and if the access to the physical address is to proceed, then the access proceeds 70 by generating a second access control signal, and switching on gates to output further bits. Thereafter, the process returns to step 66.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. Apparatus for data processing in which a data access request is made using a virtual address that requires translation to a physical address, said apparatus comprising:
   (i) a cache data memory;
   (ii) a cache hit signal generator for generating a cache hit signal indicative of data corresponding to said data access request being present in said cache data memory;
   (iii) an address translation cache having:
      (a) a plurality of storage locations, each storage location serving to store one or more access control bits within corresponding bit storage cells each having an access bit gate switched by a first access enable signal, and a physical address within corresponding bit storage cells having a physical address bit gate switched by a second access enable signal; and
      (b) a location selector responsive to said virtual address for selecting a selected location from said plurality of storage locations and supplying said first access enable signal to access bit gates of said selected storage location so as to couple respective access control bits of said selected storage location to an access control bit bus; and
   (iv) an access controller coupled to said access control bit bus and said cache hit signal generator for generating said second access control signal for supplying said physical address bit gates of said selected storage location to enable output of a physical address from said selected storage location to a physical address bus when said access control bits on said access control bit bus indicate a valid data access request and said cache hit signal does not indicate data corresponding to said data access request is present in said cache data memory;
   wherein said access controller comprises a control logic responsive to said one or more access control bits for generating a valid access signal and an AND gate for each storage location, each said AND gate having said first access enable signal as a first input, and a signal indicative of said valid data access request as a second input and said second access enable signal as an output.

2. Apparatus as claimed in claim 1, wherein said control logic is responsive to one or more access control flags input to said cache data memory.

3. Apparatus as claimed in claim 2, comprising:
   a central processing unit operable in a plurality of processing modes; wherein
   said one or more access control flags include one or more flags indicative of a current processing mode of said central processing unit.

4. Apparatus as claimed in claim 2, comprising:
   a central processing unit, wherein
   said one or more access control flags include one or more flags that are set by program controlled operation of said central processing unit.

5. Apparatus as claimed in claim 1, wherein said cache data memory includes an address translation cache, said virtual address to be translated to a physical address is represented by an input address signal, and said physical address is one or more further bits, and further comprising a buffer for buffering physical address from said address translation cache.

6. A method of data processing in which a data access request is made using a virtual address that requires translation to physical address in a system including a cache hit signal generator, an address translation cache, and an access controller, said method comprising steps of:
   (i) storing data in a cache data memory;
   (ii) generating, with the cache hit signal generator, a cache hit signal indicative of data corresponding to said data access request being present in said cache data memory;
   (iii) storing virtual to physical address mappings in an address translation cache, said address translation cache having:

a plurality of storage locations, each storage location serving to store one or more access control bits within corresponding bit storage cells each having an access bit gate switched by a first access enable signal, and a physical address within corresponding bit storage cells having a physical address bit gate switched by a second access enable signal; and in response to a virtual address signal, selecting a selected location from said plurality of storage locations and supplying said first access enable signal to access bit gates of said selected storage location so as to couple respective access control bits of said selected storage location to an access control bit bus; and (iv) generating, with the access controller coupled to the access control bit bus and the cache hit signal generator, said second access control signal for supplying said physical address bit gates of said selected storage location to enable output of a physical address from said selected storage location to a physical address bus when said access control bits on said access control bit bus indicate a valid data access request and said cache hit signal does not indicate data corresponding to said data access request is present in said cache data memory;

wherein said access controller comprises a control logic responsive to said one or more access control bits for generating a valid access signal and an AND gate for each storage location, each said AND gate having said first access enable signal as a first input, and a signal indicative of said valid data access request as a second input and said second access enable signal as an output.

* * * * *